(12) United States Patent
Dietrich

(10) Patent No.: US 7,565,466 B2
(45) Date of Patent: Jul. 21, 2009

(54) MEMORY INCLUDING AN OUTPUT POINTER CIRCUIT

(75) Inventor: Stefan Dietrich, Türkenfeld (DE)

(73) Assignee: Infineon Technologies AG, Munich (DE)

(*) Notice: Subject to any disclaimer, the term of this patent is extended or adjusted under 35 U.S.C. 154(b) by 292 days.

(21) Appl. No.: 11/386,510

(22) Filed: Mar. 22, 2006

(65) Prior Publication Data

US 2007/0260781 A1 Nov. 8, 2007

(51) Int. Cl.
- G06F 3/00 (2006.01)
- G06F 5/00 (2006.01)
- G06F 13/00 (2006.01)
- G06F 11/00 (2006.01)

(52) U.S. Cl. .............. 710/52; 711/154; 714/1
(58) Field of Classification Search .......... 710/52
See application file for complete search history.

(56) References Cited

U.S. PATENT DOCUMENTS

| | | | | |
|---|---|---|---|---|
| 6,731,567 | B2* | 5/2004 | Acharya et al. | 365/233.1 |
| 6,778,454 | B2* | 8/2004 | Duh et al. | 365/221 |
| 6,898,682 | B2* | 5/2005 | Welker et al. | 711/163 |
| 7,203,127 | B1* | 4/2007 | Tamlyn et al. | 365/233.11 |
| 7,224,625 | B2* | 5/2007 | Dietrich et al. | 365/193 |
| 2004/0022099 | A1 | 2/2004 | Ozawa | |
| 2005/0220239 | A1 | 10/2005 | Sigurdsson et al. | |
| 2005/0254307 | A1 | 11/2005 | Dietrich et al. | |

* cited by examiner

Primary Examiner—Henry W. H. Tsai
Assistant Examiner—Michael Sun
(74) Attorney, Agent, or Firm—Dicke, Billig & Czaja, PLLC

(57) ABSTRACT

A memory including an input register, an input pointer circuit, and an output pointer circuit. The input register is configured to receive and latch-in valid and invalid data via an input pointer and to output the valid data via an output pointer. The input pointer circuit is configured to provide the input pointer based on a continuously running write data strobe clock signal. The output pointer circuit is configured to provide the output pointer based on an external clock signal and to update the output pointer to point to the valid data in the input register based on a write signal.

21 Claims, 4 Drawing Sheets

MEMORY INCLUDING AN OUTPUT POINTER CIRCUIT

BACKGROUND

Integrated circuit speeds continue to increase and the amount of data processed and communicated continues to increase to meet the demands of system applications. As data volume increases, the industry continues to develop higher bandwidth communications links and larger memory sizes to prevent data communication bottlenecks and to accommodate the increased data requirements. The trends, of increasing data volume and larger memory sizes, are expected to continue into the future.

Typically, an electrical system includes a number of circuits that communicate with one another to perform system applications. The circuits can be on the same integrated circuit chip or on separate integrated circuit chips. Often, the electrical system includes one or more controllers, such as a micro-processor, and one or more memory devices, such as a random access memory (RAM) device. The RAM can be any suitable type of RAM, such as dynamic RAM (DRAM), double data rate synchronous DRAM (DDR-SDRAM), and graphics DDR-SDRAM (GDDR-SDRAM). Also, the RAM can be any suitable generation of RAM, such as first, second, third, or higher generations of RAM. The controller communicates with the memory to store data and to read the stored data.

Generally, the RAM needs to read, write, and communicate data at ever increasing speeds to handle the ever increasing data volume. In one approach, the operation frequency of the RAM is increased. In another approach, DDR-SDRAM reads and writes data on the falling edge and on the rising edge of the clock signal. Also, each higher generation of RAM includes features and improvements, such as features and improvements that increase speed, not found in lower generations.

GDDR-SDRAM is used in graphics applications, which have high data volume demands. In a proposed version of fifth-generation GDDR-SDRAM (GDDR5-SDRAM), the data synchronous clock, referred to as the write data strobe clock signal (WDQS), is a continuously running clock signal. The write data strobe clock signal no longer includes post-amble or pre-amble as it did in previous generations of GDDR-SDRAM. This implies that input registers receive data and latch-in the received data at each clock cycle, whether the received data is valid data or invalid data. However, only the valid data may be written into the memory array of the RAM.

For these and other reasons there is a need for the present invention.

SUMMARY

One aspect of the present invention provides a memory including an input register, an input pointer circuit, and an output pointer circuit. The input register is configured to receive and latch-in valid and invalid data via an input pointer and to output the valid data via an output pointer. The input pointer circuit is configured to provide the input pointer based on a continuously running write data strobe clock signal. The output pointer circuit is configured to provide the output pointer based on an external clock signal and to update the output pointer to point to the valid data in the input register based on a write signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
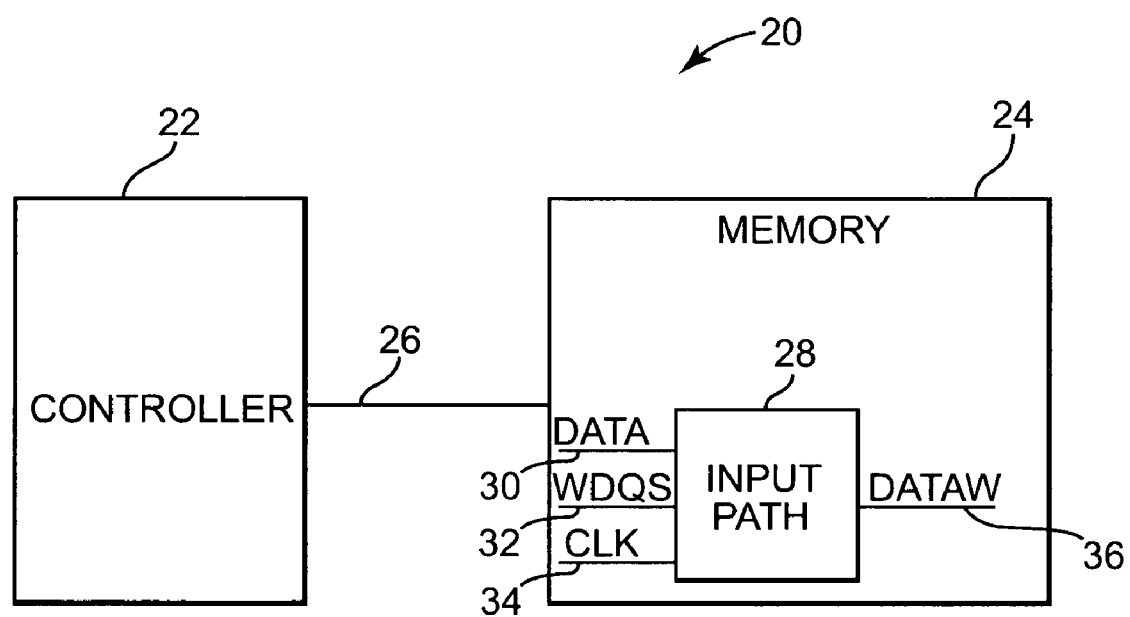
FIG. 1 is a diagram illustrating one embodiment of an electrical system according to the present invention.

FIG. 1 is a diagram illustrating one embodiment of an electrical system 20 according to the present invention. Electrical system 20 includes a controller 22 and a memory 24. Controller 22 is electrically coupled to memory 24 via memory communications path 26. Controller 22 reads data from and writes data into memory 24 via memory communications path 26. In one embodiment, electrical system 20 is a video card. In one embodiment, controller 22 is a memory controller that reads video data from and/or writes video data into memory 24. In other embodiments, electrical system 20 can be any suitable electrical system and controller 22 can be any suitable controller or control logic.

Memory 24 includes an input path 28 that receives a data signal DATA at 30, a write data strobe clock signal WDQS at 32, and an external clock signal CLK at 34. Write data strobe clock signal WDQS at 32 is a continuously running clock signal that is used to latch-in data in data signal DATA at 30. Input path 28 receives and latches-in valid data and invalid data in data signal DATA at 30 via write data strobe clock signal WDQS at 32 and an input pointer that is based on write data strobe clock signal WDQS at 32. The valid data is write data that corresponds to a write command. Input path 28 outputs the valid data in a write data signal DATAW at 36 via an output pointer that is based on external clock signal CLK at 34. Write data in write data signal DATAW at 36 is written into one or more memory arrays in memory 24.

To selectively output the valid data and not the invalid data, memory 24 provides a write signal based on write commands from controller 22. Input path 28 receives the write data, i.e., valid data, which coincides with a write command and stores the write data. Input path 28 updates the output pointer to point to the valid data based on the write signal and outputs the valid data in write data signal DATAW at 36. The write data received from controller 22 is in the write data strobe clock signal domain. The write command and output pointer are in the external clock signal domain. In one embodiment, memory 24 receives the write command and generates the write signal based on write latency and burst length. In one embodiment, memory 24 is a GDDR5-SDRAM. In other embodiments, memory 24 is any suitable RAM, such as any suitable SDRAM.

Data signal DATA at 30 includes valid data received in the form of write data from controller 22 via memory communications path 26. Controller 22 provides the write command to memory 24 in the external clock signal domain and the write data to memory 24 in the write data strobe clock signal domain. In the absence of write data, data signal DATA at 30 includes invalid data that is latched into input path 28.

Write data strobe clock signal WDQS at 32 is a continuously running clock signal used to latch-in the valid data and invalid data in data signal DATA at 30. The input pointer is based on write data strobe clock signal WDQS at 32 and is a continuously running pointer in the write data strobe clock signal domain. The input pointer points to input locations that store the received valid data and the received invalid data. Input path 28 latches-in the valid data and the invalid data in the write data strobe clock signal domain.

External clock signal CLK at 34 is a continuously running system clock. The output pointer is based on external clock signal CLK at 34 and the write command and output pointer are provided in the external clock domain. The output pointer is controlled via the write signal to point to locations that store valid write data. Input path 28 provides the valid data in write data signal DATAW at 36 to one or more memory arrays in memory 24 via write data path 36. The data in write data signal DATAW at 36 is written into one or more memory arrays in memory 24. Thus, input path 28 provides only valid write data to be written into one or more memory arrays of memory 24.

Figure 2:
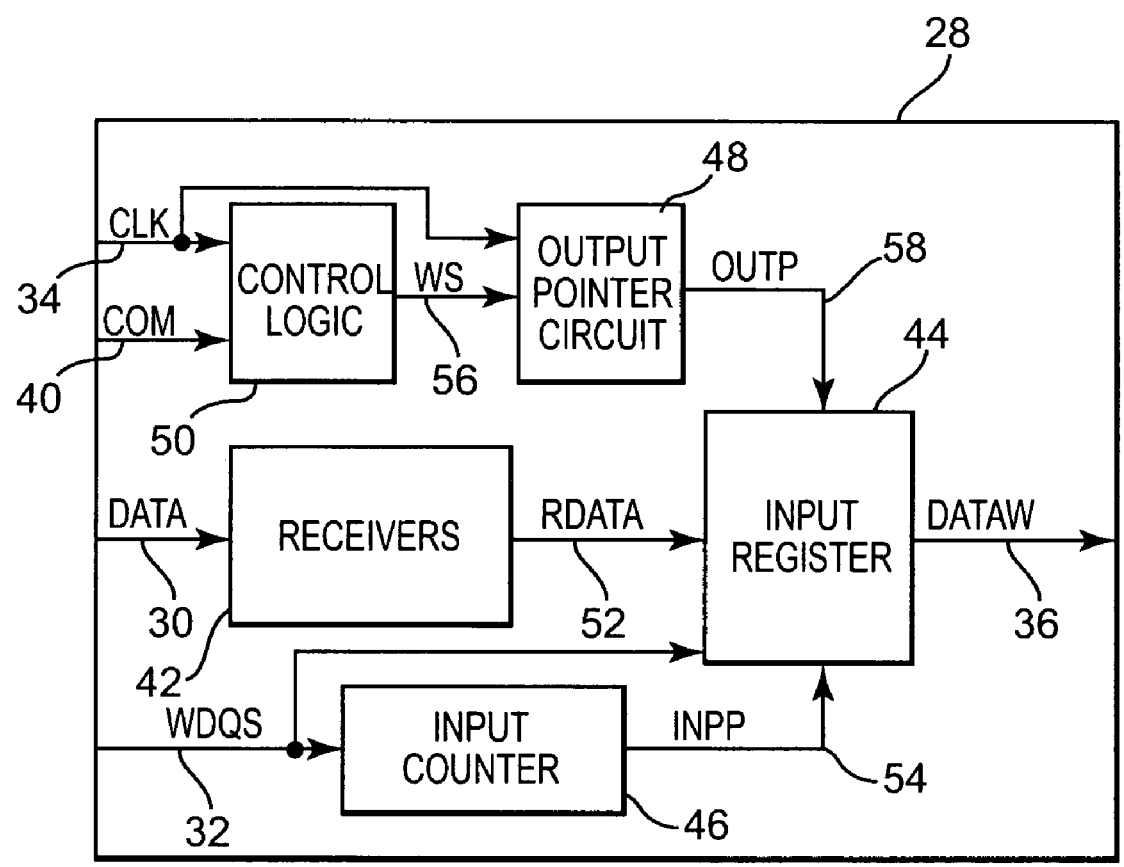
FIG. 2 is a diagram illustrating one embodiment of an input path.

FIG. 2 is a diagram illustrating one embodiment of input path 28 in memory 24. Input path 28 receives the valid and the invalid data in data signal DATA at 30 and write commands in command signal COM at 40 via controller 22. Each write command corresponds to write data, which is the valid data in data signal DATA at 30. In addition, input path 28 receives write data strobe clock signal WDQS at 32 and external clock signal CLK at 34. Input path 28 provides the valid write data from data signal DATA at 30 in write data signal DATAW at 36 and memory 24 writes the valid data into one or more memory arrays in memory 24.

Input path 28 includes receivers 42, input register 44, input counter 46, output pointer circuit 48, and control logic 50. Receivers 42 are electrically coupled to input register 44 via received data input path 52. Receivers 42 receive data signal DATA at 30 and provide the received data signal RDATA at 52 to input register 44 via received data input path 52. Received data signal RDATA at 52 includes the valid and invalid data in data signal DATA at 30.

Input counter 46 receives write data strobe clock signal WDQS at 32 and provides a repeating count sequence in input pointer signal INPP at 54. Input counter 46 is a continuously free running counter that is synchronized to write data strobe clock signal WDQS at 32. Each of the counts in the repeating count sequence of input pointer signal INPP at 54 points to a corresponding memory location or set of memory locations in input register 44. Input counter 46 is electrically coupled to input register 44 via input pointer path 54.

Input register 44 receives write data strobe clock signal WDQS at 32, input pointer signal INPP at 54, and the received data signal RDATA at 52. Input register 44 latches-in the valid data and the invalid data in received data signal RDATA at 52 via write data strobe clock signal WDQS at 32. Input register 44 latches the valid and invalid data into memory locations pointed to via the count in input pointer signal INPP at 54. In one embodiment, input register 44 is a first in first out (FIFO) memory.

Control logic 50 receives external clock signal CLK at 34 and command signal COM at 40. Control logic 50 receives write commands in command signal COM at 40. The write commands are in the external clock signal domain and synchronized to external clock signal CLK at 34. In response to each write command, control logic 50 provides an active write signal WS at 56. Control logic 50 is electrically coupled to output pointer circuit 48 via write signal path 56.

The write signal WS at 56 is activated after a delay time between receiving the write command and activating the write signal WS at 56. The delay time is based at least in part on external clock signal CLK at 34. In one embodiment, control logic 50 provides an active write signal WS at 56 after a write command based on write latency and burst length. In one embodiment, if write latency is two clock cycles of external clock signal CLK at 34 and burst length is two clock cycles of external clock signal CLK at 34, control logic 50 provides the active write signal WS at 56 just prior to the beginning of the fourth clock cycle after receiving the write command.

Output pointer circuit 48 receives external clock signal CLK at 34 and write signal WS at 56 and provides output pointer signal OUTP at 58. Output pointer circuit 48 includes an output counter (shown in FIG. 3) that provides a repeating count sequence in the external clock signal domain. The output counter is a continuously free running counter that is synchronized to external clock signal CLK at 34. Each of the counts in the repeating count sequence of the output counter points to one memory location or set of memory locations in input register 44 that was pointed to via input counter 46.

Output pointer circuit 48 uses write signal WS at 56 to control which count values are provided to input register 44 in output pointer signal OUTP at 58. If write signal WS at 56 is active, output pointer circuit 48 updates the count provided in output pointer signal OUTP at 58 to the current count of the output counter. The count in output pointer signal OUTP at 58 is updated to a count that points to valid write data in input register 44 and corresponds to the received write command. If write signal WS at 56 is not active, output pointer circuit 48 does not update the count to the current count value of the output counter, but maintains the last count in output pointer signal OUTP at 58. The output counter is phase aligned with input counter 46, such that valid write data is stored in input register 44 via input counter 46 and read from input register 44 via the output counter and output pointer circuit 48 prior to being over written. Output pointer circuit 48 is electrically coupled to input register 44 via output pointer path 58.

Input register 44 receives the output pointer signal OUTP at 58 and addresses the memory location or set of memory locations pointed to via the count value. Input register 44 outputs the valid write data and memory 24 writes the valid data into one or more memory arrays in memory 24.

In a write operation, control logic 50 receives a write command in command signal COM at 40. The write command is synchronized to external clock signal CLK at 34. Receivers 42 receive write data that corresponds to the received write command in data signal DATA at 30 and provide the write data in received data signal RDATA at 52. Input register 44 receives the valid write data and latches the valid data into memory locations pointed to via the count in input pointer signal INPP at 54. Input register 44 latches in the valid data via write data strobe clock signal WDQS at 32.

In response to the write command, control logic 50 activates write signal WS at 56 at a known delay time after receiving the write command. Output pointer circuit 48 receives the active write signal WS at 56 and updates the count provided in output pointer signal OUTP at 58 to the current count of the output counter. The count in output pointer signal OUTP at 58 is updated to the count that points to the valid data in input register 44.

Input register 44 receives the output pointer signal OUTP at 58 and addresses the memory location or set of memory locations pointed to via the count value. Input register outputs the valid data in write data signal DATAW at 36 and memory 24 writes the valid data into one or more memory arrays in memory 24. Invalid data is not addressed via the output pointer circuit 48.

Figure 3:
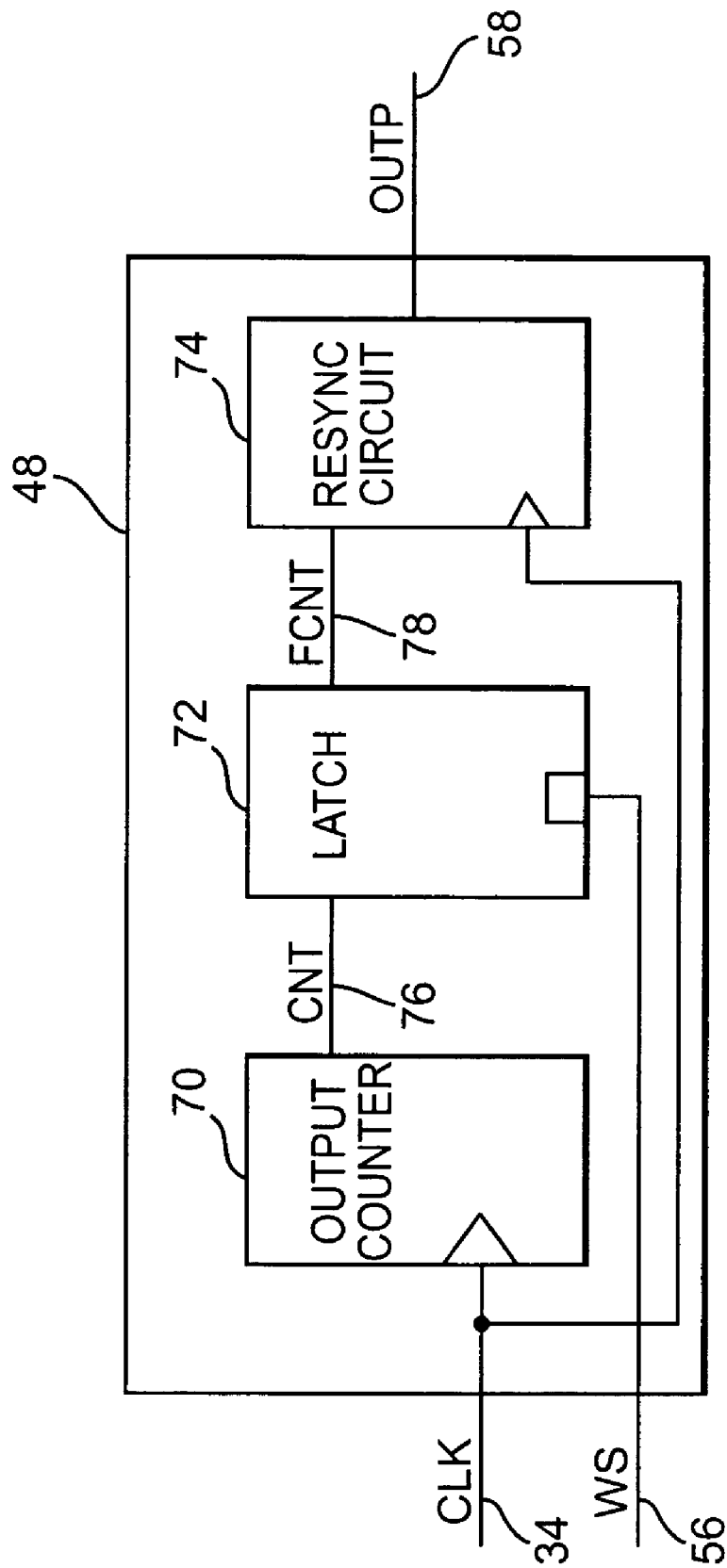
FIG. 3 is a diagram illustrating one embodiment of an output pointer circuit.

FIG. 3 is a diagram illustrating one embodiment of output pointer circuit 48 in input path 28. Output pointer circuit 48 receives external clock signal CLK at 34 and write signal WS at 56. Output pointer circuit 48 uses write signal WS at 56 to control the count provided in output pointer signal OUTP at 58. Output pointer circuit 48 updates the count in output pointer signal OUTP at 58 to point to valid write data in input register 44.

Output pointer circuit 48 includes an output counter 70, a latch 72, and a resynchronization circuit 74. Output counter 70 is electrically coupled to latch 72 via count path 76 and latch 72 is electrically coupled to resynchronization circuit 74 via filtered count path 78.

Output counter 70 is a continuously free running counter in the external clock signal domain. Output counter 70 receives external clock signal CLK at 34 and provides a repetitive count sequence in count signal CNT at 76. In one embodiment, output counter 70 provides five count values in count signal CNT at 76. In other embodiments, output counter 70 provides any suitable number of count values in count signal CNT at 76.

Latch 72 filters count signal CNT at 76 via write signal WS at 56 and provides filtered count signal FCNT at 78. Count values in filtered count signal FCNT at 78 point to locations in input register 44 that include valid write data. Latch 72 receives count signal CNT at 76 and write signal WS at 56. If write signal WS at 56 is active, latch 72 latches in the current count value of count signal CNT at 76. This updates the filtered count signal FCNT at 78 to the current count of output counter 70. The count in filtered count signal FCNT at 78 is updated to a count that points to valid write data in input register 44. If write signal WS at 58 is not active, latch 72 does not update filtered count signal FCNT at 78 to the current count of output counter 70. Instead, latch 72 maintains the previous count value in filtered count signal FCNT at 78.

Resynchronization circuit 74 synchronizes the count in filtered count signal FCNT at 78 to external clock signal CLK at 34 and provides the resynchronized count in output pointer signal OUTP at 58. Resynchronization circuit 74 receives filtered count signal FCNT at 78 and external clock signal CLK at 34. As external clock signal CLK at 34 transitions to a high logic level, resynchronization circuit 74 updates the count in output pointer signal OUTP at 58 to the updated filtered count in filtered count signal FCNT at 78. In one embodiment, resynchronization circuit 74 is one or more flip-flop circuits.

In a write operation, control logic 50 receives a write command in command signal COM at 40 and receivers 42 receive write data that corresponds to the received write command in data signal DATA at 30. Input register 44 receives the write data and latches the valid data into memory locations pointed to via the count in input pointer signal INPP at 54. Input register 44 latches-in the valid data via write data strobe clock signal WDQS at 32.

In response to the write command, control logic 50 activates write signal WS at 56 at a known delay time after receiving the write command. Latch 72 receives the active write signal WS at 56 and latches in the current count value of count signal CNT at 76. This updates the filtered count signal FCNT at 78 to the current count of output counter 70, which points to the valid write data in input register 44.

Resynchronization circuit 74 receives the updated filtered count in filtered count signal FCNT at 78 and updates the count in output pointer signal OUTP at 58 to the updated filtered count in filtered count signal FCNT at 78. Input register 44 receives the output pointer signal OUTP at 58 and addresses the memory location or set of memory locations pointed to in input register 44 via the count value. Input register 44 outputs the valid data in write data signal DATAW at 36 and memory 24 writes the valid data into one or more memory arrays in memory 24.

Figure 4:
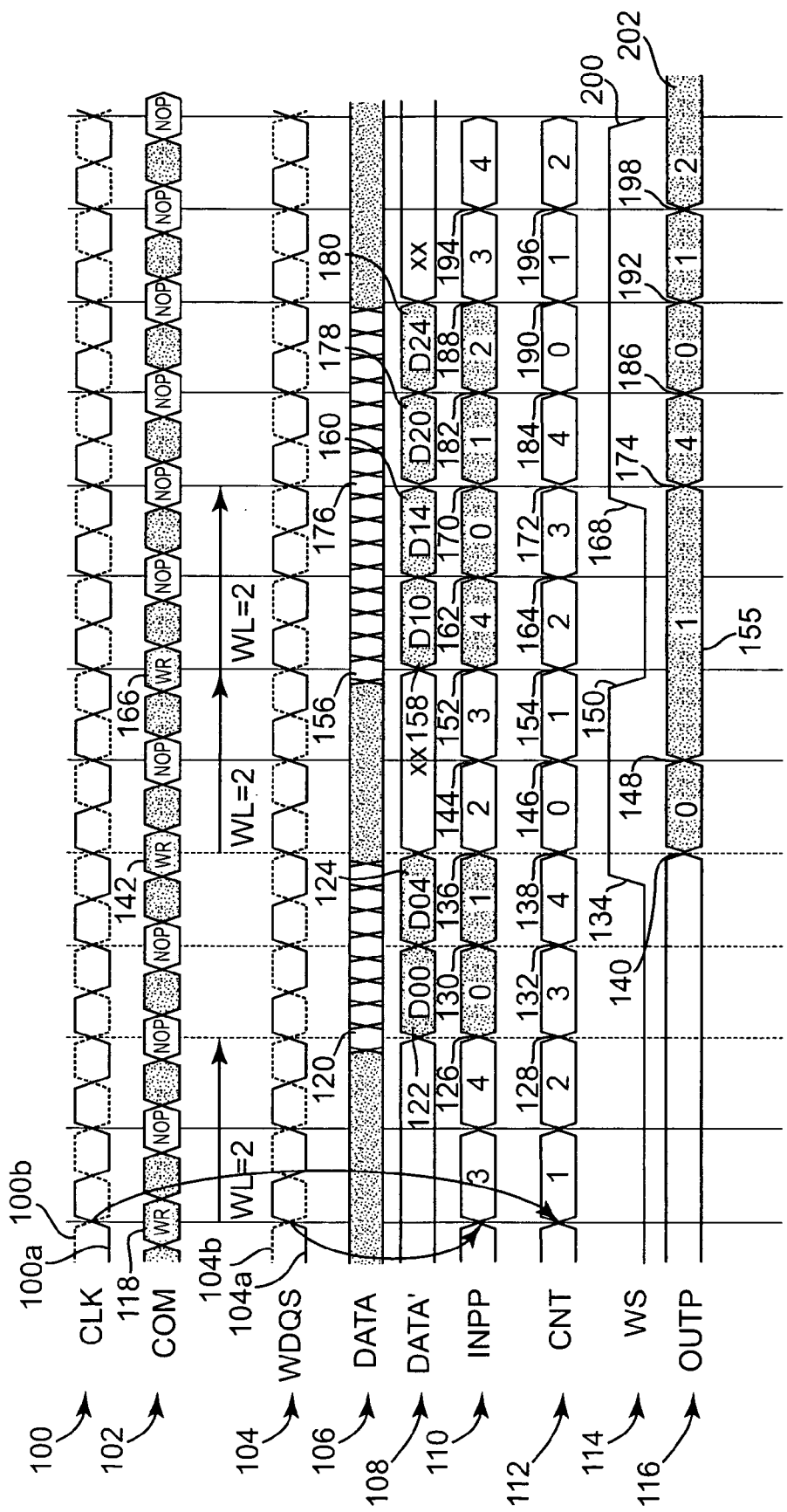
FIG. 4 is a timing diagram illustrating the operation of an input path.

FIG. 4 is a timing diagram illustrating the operation of input path 28 in memory 24. Input path 28 receives external clock signal CLK at 100, command signal COM at 102, write data strobe clock signal WDQS at 104, and data signal DATA at 106. External clock signal CLK at 100 includes non-inverted external clock signal 100*a* and inverted external clock signal 100*b*. Also, write data strobe clock signal WDQS at 104 includes non-inverted write data strobe clock signal 104*a* and inverted write data strobe clock signal 104*b*. Data signal DATA at 106 is represented as input data DATA' at 108.

Input counter 46 receives write data strobe clock signal WDQS at 104 and provides input pointer signal INPP at 110. At each rising edge of non-inverted write data strobe clock signal 104*a*, input counter 46 increments the count in input pointer signal INPP at 110. The count in input pointer signal INPP at 110 is a repeating count sequence from zero to four, where the count returns to zero after four to repeat the count sequence.

Output counter 70 receives external clock signal CLK at 100 and provides output count CNT at 112. At each rising edge of non-inverted external clock signal 100*a*, output counter 70 increments the count in output count CNT at 112. The count in output count CNT at 112 is a repeating count sequence from zero to four, where the count returns to zero after four to repeat the count sequence. Also, the count value in output count CNT at 112 is approximately two clock cycles behind the count value in input pointer signal INPP at 110.

Control logic 50 receives command signal COM at 102 and external clock signal CLK at 100 and provides write signal WS at 114. In response to a write command WR, control logic 50 provides a high logic level in, i.e., activates, write signal WS at 114. Latch 72 receives the active write signal WS at 114 and updates the filtered count FCNT at 78 to the current count value of output counter 70. Resynchronization circuit 74 receives filtered count FCNT at 78 (shown in FIG. 3) and updates output pointer signal OUTP at 116. Input register 44 outputs valid write data in write data signal DATAW at 36 (shown in FIG. 2), which is pointed to via output pointer signal OUTP at 116.

At 118, command signal COM at 102 includes a write command WR that is clocked into control logic 50 via the rising edge of non-inverted external clock signal 100a. Also, output count CNT at 112 is incremented to a count value of 1 via the rising edge of non-inverted external clock signal 100a and input pointer signal INPP at 110 is incremented to a count value of 3 via the rising edge of non-inverted write data strobe clock signal 104a.

In this example, memory 24 has a write latency of 2 (WL=2) and a burst length of 8 (BL=8), such that eight bits of valid write data are provided beginning at 120 approximately two clock cycles of the external clock signal CLK at 100 after write command WR at 118. The valid write data is provided over approximately two clock cycles of external clock signal CLK at 100.

The first four bits of write data at 120 are represented as D00 at 122 in input data DATA' at 108 and the second four bits of write data at 120 are represented as D04 at 124 in input data DATA' at 108. At 126, input pointer signal INPP at 110 is incremented to a count value of 0 via the rising edge of non-inverted write data strobe clock signal 104a and at 128 output count CNT at 112 is incremented to a count value of 3 via the rising edge of non-inverted external clock signal 100a. The first four bits of write data D00 at 122 are stored at locations in input register 44 addressed via count value 0 in input pointer signal INPP at 110. At 130, input pointer signal INPP at 110 is incremented to a count value of 1 via the rising edge of non-inverted write data strobe clock signal 104a and at 132 output count CNT at 112 is incremented to a count value of 4 via the rising edge of non-inverted external clock signal 100a. The second four bits of write data D04 at 124 are stored at locations in input register 44 addressed via count value 1 in input pointer signal INPP at 110.

Write signal WS at 114 is activated to a high logic level at 134 just prior to the fourth clock cycle after write command WR at 118. The four clock cycles include two write latency clock cycles and two clock cycles for a data burst of 8 bits. At 136, input pointer signal INPP at 110 is incremented to a count value of 2 via the rising edge of non-inverted write data strobe clock signal 104a and at 138 output count CNT at 112 is incremented to a count value of 0 via the rising edge of non-inverted external clock signal 100a. At 140, latch 72 and resynchronization circuit 74 update the count value in output pointer signal OUTP at 116 to a count value of 0 and input register 44 outputs the valid write data addressed via the count value of 0 at 140. Input register 44 latches invalid data xx into locations addressed via input count 2 in input pointer signal INPP at 110.

At 142, command signal COM at 102 includes a second write command WR that is clocked into control logic 50 via the rising edge of non-inverted external clock signal 100a. At 144, input pointer signal INPP at 110 is incremented to a count value of 3 via the rising edge of non-inverted write data strobe clock signal 104a and at 146 output count CNT at 112 is incremented to a count value of 1 via the rising edge of non-inverted external clock signal 100a. At 148, latch 72 and resynchronization circuit 74 update the count value in output pointer signal OUTP at 116 to a count value of 1 and input register 44 outputs the valid write data addressed via the count of 1 at 146. Input register 44 latches invalid data xx into locations addressed via input count 3 in input pointer signal INPP at 110.

Write signal WS at 114 is deactivated to a low logic level at 150 just prior to the sixth clock cycle after write command WR at 118. At 152, input pointer signal INPP at 110 is incremented to a count value of 4 via the rising edge of non-inverted write data strobe clock signal 104a and at 154 output count CNT at 112 is incremented to a count value of 2 via the rising edge of non-inverted external clock signal 100a. The deactivated write signal WS at 114, prevents updating the count value in output pointer signal OUTP at 116 to a count value of 2 and later to a count value of 3. Latch 72 holds the count value of 1 and, at 155, resynchronization circuit 74 outputs a count value of 1 in output pointer signal OUTP at 116. Invalid data addressed via count values of 2 and 3 are not output via input register 44.

Since memory 24 has a write latency of 2 and a burst length of 8, eight bits of valid write data are provided beginning at 156 and approximately two clock cycles of external clock signal CLK at 100 after write command WR at 142. The eight bits of valid write data beginning at 156 are provided over approximately two clock cycles of external clock signal CLK at 100 and correspond to the write command WR at 142.

The first four bits of write data at 156 are represented as D10 at 158 in input data DATA' at 108 and the second four bits of write data at 156 are represented as D14 at 160 in input data DATA' at 108. The first four bits of write data D10 at 158 are stored at locations in input register 44 addressed via count value 4 in input pointer signal INPP at 110. At 162, input pointer signal INPP at 110 is incremented to a count value of 0 via the rising edge of non-inverted write data strobe clock signal 104a and at 164 output count CNT at 112 is incremented to a count value of 3 via the rising edge of non-inverted external clock signal 100a. The second four bits of write data D14 at 160 are stored at locations in input register 44 addressed via count value 0 in input pointer signal INPP at 110.

Write signal WS at 114 is activated to a high logic level at 168 just prior to the fourth clock cycle after write command WR at 142. The four clock cycles include two write latency clock cycles and two clock cycles for a data burst of 8 bits. At 170, input pointer signal INPP at 110 is incremented to a count value of 1 via the rising edge of non-inverted write data strobe clock signal 104a and at 172 output count CNT at 112 is incremented to a count value of 4 via the rising edge of non-inverted external clock signal 100a. At 174, latch 72 and resynchronization circuit 74 update the count value in output pointer signal OUTP at 116 to a count value of 4 and input register 44 outputs the valid write data addressed via the count value of 4 at 174.

At 166, command signal COM at 102 includes another write command WR that is clocked into control logic 50 via the rising edge of non-inverted external clock signal 100a. At 176, since memory 24 has a write latency of 2 and a burst length of 8, eight bits of valid write data are provided approximately two clock cycles of external clock signal CLK at 100 after write command WR at 166. The eight bits of valid write data beginning at 176 are provide over approximately two clock cycles of external clock signal CLK at 100 and correspond to the write command WR at 166.

The first four bits of write data at 176 are represented as D20 at 178 in input data DATA' at 108 and the second four bits of write data at 176 are represented as D24 at 180 in input data DATA' at 108. The first four bits of write data D20 at 178 are stored at locations in input register 44 addressed via count value 1 in input pointer signal INPP at 110. At 182, input pointer signal INPP at 110 is incremented to a count value of 2 via the rising edge of non-inverted write data strobe clock signal 104a and at 184 output count CNT at 112 is incremented to a count value of 0 via the rising edge of non-inverted external clock signal 100*a*. The second four bits of write data D24 at 180 are stored at locations in input register 44 addressed via count value 2 in input pointer signal INPP at 110. Also, at 186, latch 72 and resynchronization circuit 74 update the count value in output pointer signal OUTP at 116 to a count value of 0 and input register 44 outputs the valid write data addressed via the count value of 0 at 174.

Next, at 188 input pointer signal INPP at 110 is incremented to a count value of 3 via the rising edge of non-inverted write data strobe clock signal 104*a* and at 190 output count CNT at 112 is incremented to a count value of 1 via the rising edge of non-inverted external clock signal 100*a*. Input register 44 latches invalid data xx into locations addressed via input count 3 in input pointer signal INPP at 110. At 192, latch 72 and resynchronization circuit 74 update the count value in output pointer signal OUTP at 116 to a count value of 1 and input register 44 outputs the valid write data addressed via the count value of 1 at 192.

At 194 input pointer signal INPP at 110 is incremented to a count value of 4 via the rising edge of non-inverted write data strobe clock signal 104*a* and at 196 output count CNT at 112 is incremented to a count value of 2 via the rising edge of non-inverted external clock signal 100*a*. Input register 44 latches invalid data xx into locations addressed via input count 4 in input pointer signal INPP at 110. At 198, latch 72 and resynchronization circuit 74 update the count value in output pointer signal OUTP at 116 to a count value of 2 and input register 44 outputs the valid write data addressed via the count value of 2 at 198.

Write signal WS at 114 is deactivated to a low logic level at 200 just prior to the sixth clock cycle after write command WR at 166. The deactivated write signal WS at 114, prevents updating the count value in output pointer signal OUTP at 116 to a count value of 3. At 202, latch 72 holds the count value of 2 and resynchronization circuit 74 outputs a count value of 2 in output pointer signal OUTP at 116. Invalid data in locations addressed via count value 3 is not output via input register 44. The process continues for subsequent write commands WR in command signal COM at 102.

Input path 28 in memory 24 receives a write data strobe clock signal WDQS that is a continuously free running clock signal used to latch valid and invalid data into an input register 44. The valid data is write data that corresponds to write commands. Input path 28 includes an output pointer circuit 48 that receives a write signal WS that is based on the write commands. The output pointer circuit 48 outputs count values that point to the valid data in the input register 44. Thus, input path 28 provides only valid write data to be written into one or more memory arrays in memory 24.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
an input register configured to receive and latch-in valid and invalid data based on an input pointer and to output the valid data based on an output pointer;
an input pointer circuit configured to provide a continuously running repetitive output count as the input pointer based on a continuously running write data strobe clock signal; and
an output pointer circuit configured to receive an external clock and a write signal comprising:
an output counter configured to provide a continuously running repetitive output count based on the external clock signal; and
an update circuit configured to provide the output pointer and to update the output pointer with the output count to point to the valid data in the input register based on the write signal.

2. The memory of claim 1, wherein the update circuit comprises:
a latch configured to receive and latch-in the output count based on the write signal and to provide a filtered count.

3. The memory of claim 2, wherein the update circuit comprises:
a resynchronization circuit configured to receive the filtered count and resynchronize the filtered count to the external clock signal to provide the output pointer.

4. The memory of claim 1, comprising:
control logic configured to receive a write command and provide the write signal based on the write command.

5. The memory of claim 1, comprising:
control logic configured to provide the write signal based on write latency and burst length.

6. The memory of claim 1, wherein the input register is a first in first out input register.

7. An electrical system comprising:
a random access memory including:
an input register configured to receive and latch-in valid and invalid data in a continuously running write data strobe clock signal domain;
an output pointer circuit configured to provide an output pointer in an external clock signal domain based on an external clock signal; and
control logic configured to provide a write signal based on a write command signal, wherein the output pointer circuit includes an output counter configured to provide a continuously running repetitive output count based on the external clock signal, receives the write signal, and includes an update circuit which updates the output pointer with the output count to point to the valid data in the input register based on the write signal.

8. The electrical system of claim 7, wherein the control logic provides the write signal based on write latency and burst length.

9. The electrical system of claim 7, wherein the random access memory comprises:
an input pointer circuit configured to provide an input pointer in the continuously running write data strobe clock signal domain, wherein the input register latches in the valid and the invalid data based on the input pointer.

10. The electrical system of claim 7, wherein the update circuit comprises:
a latch configured to receive and latch-in the output count based on the write signal and to provide a filtered count; and
a resynchronization circuit configured to receive the filtered count and resynchronize the filtered count to the external clock signal domain to provide the output pointer.

11. The electrical system of claim 7, comprising:
a host controller configured to provide video data, wherein the random access memory receives and stores the video data.

12. The electrical system of claim 7, wherein the random access memory is a graphics double data rate random access memory.

13. A random access memory comprising:
    means for latching-in valid and invalid data in a continuously running write data strobe clock signal domain;
    means for providing an output pointer in an external clock signal domain based on an external clock signal;
    means for providing a write signal based on a write command signal;
    means for providing a continuously running repetitive output count based on the external clock signal; and
    means for updating the output pointer with the output count to point to the valid data in the means for latching-in valid and invalid data based on the write signal.

14. The random access memory of claim 13, wherein the means for providing a write signal comprises:
    means for providing the write signal based on write latency and burst length.

15. The random access memory of claim 13, wherein the means for updating the output pointer comprises:
    means for latching-in the output count based on the write signal to provide a filtered count.

16. The random access memory of claim 15, wherein the means for updating the output pointer comprises:
    means for resynchronizing the filtered count to the external clock signal domain to provide the output pointer.

17. A method for inputting valid data in a random access memory comprising:
    latching-in valid and invalid data in a continuously running write data strobe clock signal domain;
    providing an output pointer in an external clock signal domain based on an external clock signal;
    providing a write signal based on a write command signal;
    providing a continuously running repetitive output count based on the external clock signal; and
    selectively updating the output pointer with the output counter to point to the valid data based on the write signal.

18. The method of claim 17, wherein providing a write signal comprises:
    providing the write signal based on write latency and burst length.

19. The method of claim 17, wherein updating the output pointer comprises:
    latching-in the output count based on the write signal to provide a filtered count; and
    resynchronizing the filtered count to the external clock signal domain.

20. A method for inputting valid data in a memory comprising:
    receiving valid and invalid data;
    providing an input pointer based on a continuously running write data strobe clock signal;
    latching-in the valid and the invalid data via the input pointer;
    providing an output pointer based on an external clock signal;
    receiving a write command;
    providing a write signal based on the write command;
    providing a continuously running repetitive output count based on the external clock signal;
    selectively updating the output pointer with the output count to point to the valid data based on the write signal; and
    outputting the valid data via the output pointer.

21. The method of claim 20, wherein updating the output pointer comprises:
    receiving the output count;
    latching-in the output count based on the write signal to provide a filtered count;
    receiving the filtered count; and
    resynchronizing the filtered count to the external clock signal domain to provide the output pointer.

* * * * *